United States Patent [19]

Wilson et al.

[11] Patent Number: 4,740,481

[45] Date of Patent: Apr. 26, 1988

[54] METHOD OF PREVENTING HILLOCK FORMATION IN POLYSILICON LAYER BY OXYGEN IMPLANATION

[75] Inventors: Syd R. Wilson; Richard B. Gregory, both of Phoenix; Charles J. Varker, Scottsdale, all of Ariz.

[73] Assignee: Motorola Inc., Schaumburg, Ill.

[21] Appl. No.: 820,858

[22] Filed: Jan. 21, 1986

[51] Int. Cl.$^4$ .................. H01L 21/265; H01L 29/04
[52] U.S. Cl. ........................................ 437/24; 357/91; 148/DIG. 24; 148/DIG. 61; 148/DIG. 83
[58] Field of Search ............... 148/1.5; 29/571, 576 B; 357/91; 437/24

[56] References Cited

U.S. PATENT DOCUMENTS 4,171,997 10/1979 Irmler .................................. 148/187
4,704,367 11/1987 Alvis et al. ............................ 437/24

FOREIGN PATENT DOCUMENTS 56-18430 2/1981 Japan ........................ 148/DIG. 128

OTHER PUBLICATIONS

Wada et al, Jap. Jour. Appl. Phys. 15 (1976) 1725.
Stein, Appl. Phys. Lett. 43 (1983) 296.
Hezel et al, Jour. Electrochem. Soc. 129 (1982) 379.
Angelucci et al, Thin Solid Films, 103 (1983) 275.
Lee, C. H., IBM-TDB, 24 (1981) 2179.
Kwizera et al, in VLSI Science & Technology 1982, ed. Dell'oca et al, Pennington, N.J.; USA, p. 147.
Kamei et al., IEDM-84, Dec. 1984, p. 138.
Wilson, S. R., "Semi-Technology Symp.", 1984, vol. I-39, 1984.
S. R. Wilson, "Properties of Ion-Implanted Polycrystalline Si Layers Subjected to Rapid Thermal Annealing", J. Electrochem. Soc. vol. 132, No. 4, Apr. 1985, pp. 922-929.
S. J. Krause, "Grain Growth Processes During Transient Annealing of As-Implanted Polycrystalline-Silicon Films", Mat. Res. Soc. Symp. Proc., vol. 35, 1985, pp. 721-726.
S. R. Wilson et al., "Rapid Annealing Technology for Future VSLI", Solid State Technology, Jun. 1985, pp. 185-190.
S. R. Wilson, "Transient Annealing of Ion Implanted Semiconductor Materials", Nuclear Instruments and Methods in Physics Research, B6, (1985), pp. 307-315.
S. J. Krause, "Grain Growth During Transient Annealing of Implanted Polycrystalline Silicon Films", Appl. Phys. Lett., vol. 45 (7), 1 Oct. 1984, pp. 778-780.
S. R. Wilson, "Fast Diffusion of As in Polycrystalline Silicon During Rapid Thermal Annealing", Appl. Phys. Letter, vol. 45(4), 15 Aug. 1984, pp. 464-466.
C. P. Wu, "Improved Conductivity in Polysilicon Films by Pre-Annealing", J. Electrochem Sock., vol. 131, No. 1, pp. 216-217.

(List continued on next page.)

Primary Examiner—Roy Upendra
Attorney, Agent, or Firm—Robert M. Handy

[57] ABSTRACT

Hillock formation as a result of heating uncapped polycrystalline silicon layers can be avoided by first implanting the uncapped poly layers with silicon, oxygen, or nitrogen prior to heating. Equivalent mono-atomic oxygen or nitrogen doses in the range of about $10^{15}$ to about $5 \times 10^{16}$ ions/cm$^2$ at energies in the range 10-50 keV are useful with good results being obtained with equivalent oxygen doses of $2 \times 10^{15}$ ions/cm$^2$ at 30 keV. When polysilicon layers with this oxygen implant are heated to about 1150 degrees C., a temperature which would ordinarily produce pronounced hillock formation in un-capped, un-treated poly layers, it is found that hillock formation is suppressed. The implanted oxygen concentrations are far below what is required to produce a separate oxide layer or phase. Some effect on poly layer sheet resistance is observed for implanted oxygen but the implanted layers have sheet resistances within a factor of two of those without the oxygen implants.

3 Claims, 3 Drawing Sheets

OTHER PUBLICATIONS

S. R. Wilson et al., "An Overview and Comparison of Rapid Thermal Processing Equipment: A User's Viewpoint", oral paper presented at the Material Research Society Symposium held Dec. 3, 1985 to be published about Jun. 1986.

S. J. Krause et al., "Structual Changes During Transient Post-Annealing of Pre-Annealed and Arsenic Implanted Polycrystalline Silicon Films", oral paper presented at the Materials Research Society Symp. held Dec. 3, 1985–to be published about Jun. 1986.

S. J. Krause et al. "Effective Transient Annealing on Grain Growth and Structure of Polycrystalline Silicon Films", Inst. Phys. Conf. Ser., No. 76, Sec. 3, paper presented at the Microse. Semi. Mater. Conf., Oxford, 25–27, Mar., 1985, pp. 105–110.

S. R. Wilson et al., "Rapid Isothermal Anneal of $^{75}$As Implanted Silicon Appln. Phys. Letter, vol. 41 (10), 15 Nov. 1982, pp. 978–980.

S. R. Wilson et al., "Characterization of Ion Implanted Silicon Annealed with a Graphite Radiation Source", IEEE Transactions on Nuclear Science, vol. NS-30, No. 2, Apr. 1983, pp. 1734–1737.

S. R. Wilson et al., "Isothermal Annealing of Ion Implanted Silicon with a Graphite Radiation Source", Mat. Res. Soc. Symp. Proc., vol. 13 (1983), Elsevier Science Publishing Co., pp. 369–374.

R. B. Gregory et al., "Increasing the Conductivity of Polycrystalline Silicon by Rapid Thermal Processing Before and After Ion Implantation", Spie Proceedings, vol. 623, 1986.

S. J. Krause et al., "Effect of Background Doping on the Superficial Silicon Layer of SOT Wafers Synthesized by Oxygen Implantation", 5th International Symposium on Silicon Materials Science and Technology, May 1985.

R. N. Legge et al., "The Effects of Rapid Thermal Annealing on Si-Implanted GaAs", Spie Proceedings, publication date approx. Jan 1986.

10 MICRONS

1 MICRON

1 MICRON

METHOD OF PREVENTING HILLOCK FORMATION IN POLYSILICON LAYER BY OXYGEN IMPLANATION

BACKGROUND OF THE INVENTION

1. Field of the Invention

This invention relates in general to means and methods for stabilizing the properties of polycrystalline semiconductor layers and, more particularly, to means and method for controlling surface hillock growth in polycrystalline semiconductor layers during high temperature processing.

2. Background Art

Electronic devices using polycrystalline semiconductors often exhibit problems associated with the formation of surface roughness in the poly. For example, when un-capped layers of polysilicon are heated, such as during activation or redistribution of a dopant, it is observed that bumps, hillocks, and/or spikes form on the surface of the poly. These uneven surface features, collectively referred to herein as hillocks, can degrade the integrity of any subsequent layers placed on top of the poly, as for example dielectrics used for passivation or multi-layer interconnections.

It is known that hillock formation may be avoided in polysilicon, for example, by capping the poly layer prior to heating. Capping consists of applying a covering layer of another material such as silicon dioxide or silicon nitride. However, under certain circumstances it is not practical to use a cap layer over the poly, and in these situations hillock formation has heretofore been unavoidable. Examples of such situations are when a high temperature processing step must be used prior to providing the cap layer, or when the insulating cap layer would interfere with making good electrical contact to the poly layer, or where the cap layer would interfere with subsequent processing steps. Thus, a need continues to exist for improved means and methods for overcoming hillock formation and other problems arising in connection with polycrystalline semiconductor layers.

Accordingly, it is an objective of the present invention to provide improved means and methods for preventing hillock formation in the surface of polycrystalline semiconductor layers during heat treatment.

It is an additional object of the present invention to prevent hillock formation in polycrystalline semiconductor layers without using a cap layer.

It is a further object of the present invention to prevent hillock formation in polycrystalline semiconductor layers without using a surface insulating layer.

As used herein the words "dopant" or "doping" are intended to refer to the class of impurities which provide substantial number of shallow donor or acceptor levels in the semiconductor so as to substantially alter the conductivity of the material. In the case of silicon materials, examples of this class of dopants are arsenic, boron, phosphorous, antimony, aluminum, gallium, and indium, but not oxygen or nitrogen. Those of skill in the art will understand that other such dopant elements exist for use in silicon and other semiconductor materials. As used herein the words "high temperature" are intended to refer to temperatures where the phenomena of interest are proceeding at a rate significant compared to the time periods of interest. For example, for dopant migration or oxidation of silicon, this is generally above about 1000 degrees C. Those of skill in the art will understand that different temperatures apply for different phenomena and materials.

SUMMARY OF THE INVENTION

The attainment of the foregoing and other objects and advantages is achieved through the present invention wherein there is provided a means and method for stabilizing polycrystalline layers so as to inhibit formation of surface hillocks by providing within the polycrystalline material a migration inhibiting agent which acts to stabilize the grain boundaries of the polycrystalline layer near the exposed surface so that the activation energy for rearrangement of the surface into hillocks is increased. It has been discovered that hillock formation can be suppressed by implanting silicon, oxygen or nitrogen into the near surface regions of the polycrystalline layer prior to any high temperature heat treatments. A cap layer is not required to prevent hillock formation. The amount of oxygen or nitrogen required to inhibit hillock formation is much less than that required to form a surface oxide or nitride layer. While oxygen implantation, for example, measureably increases the sheet resistance of the poly layer, the poly can still be readily doped so as to be highly conducting and useful for device purposes.

No significant hillock inhibiting effect is obtained in silicon until the oxygen or nitrogen implant doses exceed a few times $10^{14}$ ions/cm$^2$. Higher doses, for example in the range $10^{15}$ ions/cm$^2$ to about $5 \times 10^{16}$ ions/cm$^2$ are useful. Substantially higher oxygen or nitrogen doses are not likely to be useful in silicon because a dielectric layer can form. This dielectric layer is expected to substantially increase the contact or sheet resistance of the polycrystalline semiconductor layer and reduce its usefulness for device purposes. Using implanted silicon to inhibit hillock formation in polysilicon has the advantage of not affecting the contact or sheet resistance as does oxygen or nitrogen.

Implant energies which place the implant distribution at or near the poly surface are used. For example in silicon, O+ equivalent implant energies in the range 10–50 keV are useful, with 20–40 keV being convenient and 30 keV being typical.

The details of the present invention are more completely described in the figures and description which follow.

DETAILED DESCRIPTION OF THE DRAWINGS

For purposes of explanation, the device structures and methods herein are shown for the case of silicon based semiconductor devices and polycrystalline silicon layers. However, those of skill in the art will understand that these means and methods apply to other semiconductor substrates and other polycrystalline semiconductors, and are presented merely as an aid to understanding and not intended to be limiting, and that other materials may also be used.

In FIGS. 1-2, unless otherwise noted, implanted or doped regions of the poly are generally shown stippled, dielectric layers or regions are shown hatched, and single crystal regions or undoped poly regions are shown clear. Arrows at the boundaries of the dopant implanted regions in the poly are used to indicate the direction of migration of the dopant atoms in the poly during subsequent high temperature operations.

Figure 1A:
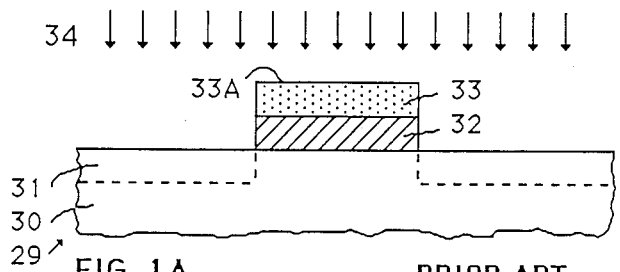
FIGS. 1A–C show simplified schematic cross-sectional views of a portion of a semiconductor device containing a polycrystalline region and indicating the surface roughening phenomenon observed following uncapped high temperature heat treatment.
Figure 1B:
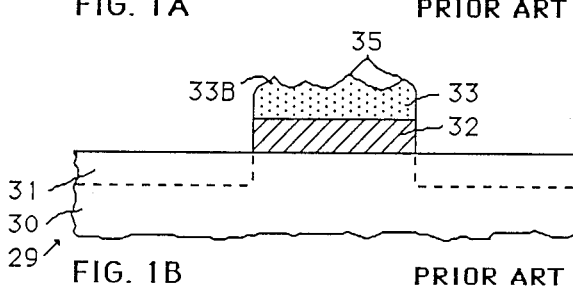
Figure 1C:
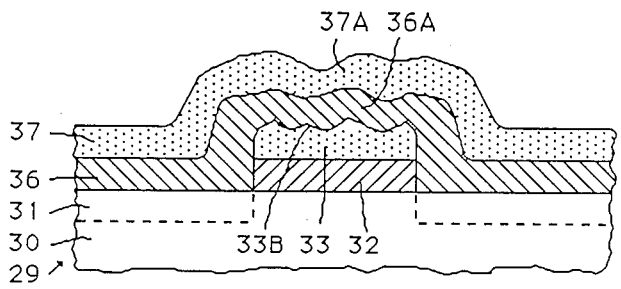

FIGS 1A-C show in simplified schematic cross-sectional form, a portion of a semiconductor device exhibiting hillock formation in a polysilicon layer. Device portion 29, which may be for example a MOSFET, comprises substrate 30, dielectric region 32, and superposed polycrystalline semiconductor region 33 having substantially smooth upper surface 33a. Implanted dopant ions 34 dope poly region 33 and portions 31 of substrate 30. However it is not essential that substrate 30 be doped and a MOSFET need not be formed. For example, dielectric 32 may cover the surface of substrate 31 while poly region 33 functions merely as a first layer interconnect running into the plane of the figure.

It is observed that if poly region 33 is left uncapped during subsequent heat treatment, as for example, during high temperature processing to activate dopant 34 and anneal the implant damage, that hillocks or bumps 35 form in the surface of region 33, i.e., originally smooth surface 33a changes into rough surface 33b. When rough surface 33b is subsequently covered, for example, with second dielectric 36 and second conductor layer 37, hillocks or bumps 35 degrade the integrity of portion 36a of layer 36 and may also adversely affect step coverage of portion 37a of layer 37. This is undesirable.

Figure 2A:
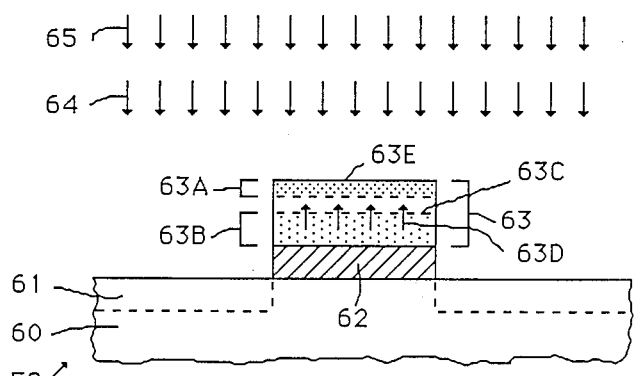
FIGS. 2A–C show simplified schematic cross-sectional views of a semiconductor device similar to FIGS. 1A–C, but according to the present invention wherein hillock formation is prevented.
Figure 2B:
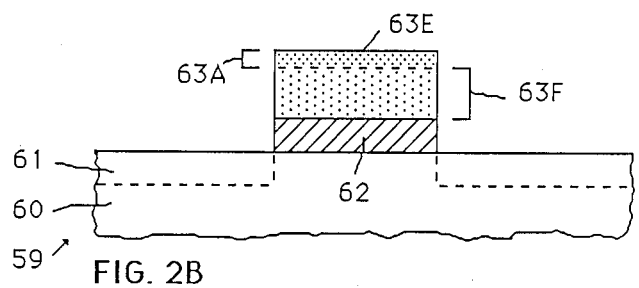
Figure 2C:
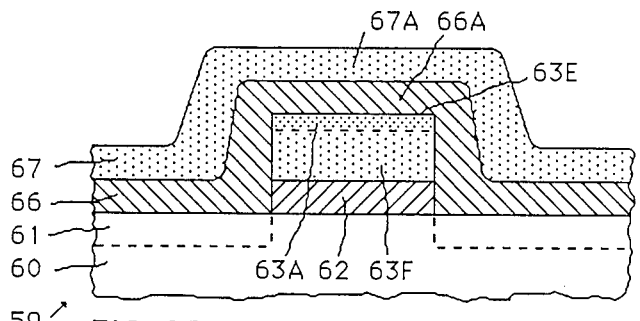
Figure 3A:
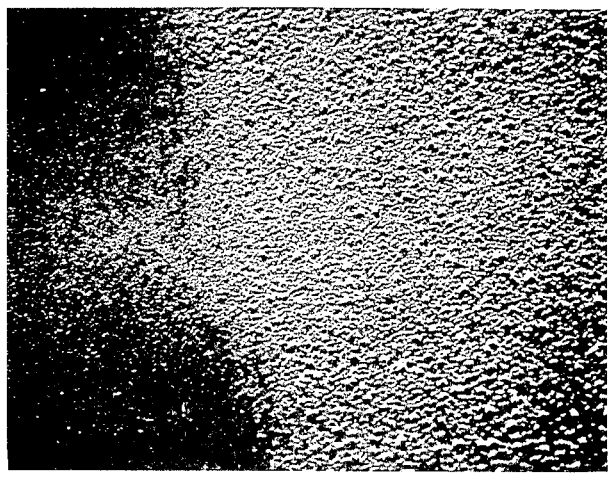
FIGS. 3A–C show SEM photomicrographs at different magnifications of portions of a polysilicon layer, with and without oxygen implantation, and after high temperature heat treatment.
Figure 3B:
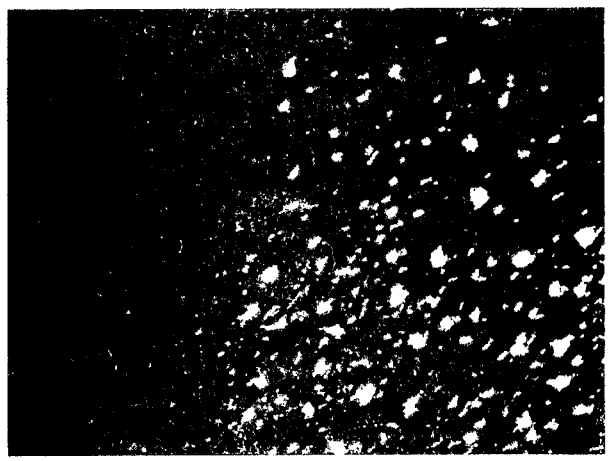
Figure 3C:
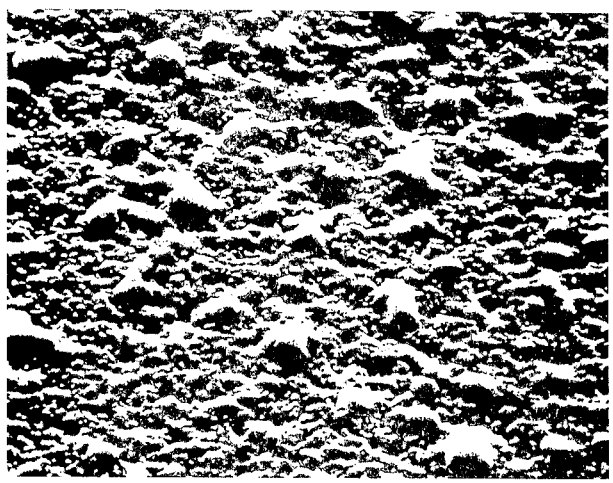

These and other problems are overcome with the means and method of the present invention illustrated in FIGS. 2A-C and described more fully in connection with FIGS. 3A-C.

The problems illustrated in FIGS. 1A-C may be overcome by the means and method illustrated in connection with FIGS. 2A-C wherein device portion 59, similar to portion 29 of FIGS. 1A-C, comprises substrate 60, doped regions 61, surface dielectric region 62 and superposed poly region 63. Portion 63b of poly region 63 has been implanted with dopant ions 65 either before or after formation of region 63a, but in FIG. 2A has not yet been subjected to any high temperature processing sufficient to cause grain boundary migration of dopant ions 65 in region 63 or hillock formation. Arrows 63d at dopant implant boundary 63c indicate the direction of movement of dopant ions 65 during high temperature processing. Portion 63a is formed at or immediately adjacent surface 63e of region 63. Portion 63a contains added silicon, oxygen, or nitrogen, or mixtures thereof, and is preferably formed by implantation of silicon, oxygen, or nitrogen ions 64. Portion 63b containing dopant ions 65 has been illustrated as being placed relatively deeply in region 63 and below portion 63a. However, this is not essential. So far as preventing hillock formation is concerned, the location of doped portion 63b is not important. It is only important that portion 63a be at or immediately adjacent exposed surface 63e.

It has been found that when silicon, oxygen, or nitrogen ions, or mixtures thereof are implanted into surface portion 63a of region 63, that hillock formation is prevented during subsequent high temperature processing, as shown in FIGS. 6B-C. Accordingly surface 63e remains smooth and subsequently formed dielectric layer 66 and poly layer 67 are not disturbed. Portions 66a and 67a above surface 63e are not degraded by any hillock formation in region 63.

EXPERIMENTAL RESULTS

Polycrystalline silicon layers of about 0.6 microns thickness were formed on oxidized silicon wafers using LPCVD techniques well known in the art. The as-deposited films or layers had grains typically 0.02 microns in diameter. Accordingly, prior to heating the layers were about thirty grain sizes thick. After heating, grain sizes increased to about 0.2-0.6 microns. It was observed that if such films were heat treated without a cap layer, for example heated from room temperature to a peak temperature of about 1150 degrees C. and back to about room temperature again in about 20-25 seconds, that the surface of the polysilicon layer was substantially roughened. Hillocks, bumps, and spikes formed in what previously had been a smooth polysilicon surface. The heating was carried out in a Rapid Thermal Annealing (RTA) apparatus, type IA-200 manufactured by Varian Associates, Gloucester, Mass. This type of apparatus is capable of very rapid heating and cooling of semiconductor wafers, and unless otherwise noted, was used for all of the high temperature operations carried out in connection with this invention. The effective time at the peak temperature is estimated to be about one second. Similar hillock growth also occurs when slower heating methods are used. In general, hillock formation increases in severity as heating time and temperature are increased.

It was found that if the exposed surface of the polysilicon layer was implanted with oxygen to a dose far below that required to produce a surface oxide layer, that the tendency of the surface to erupt into hillocks on heating was substantially arrested. Implanting the exposed polysilicon surface with silicon ions also inhibits hillock formation in the polysilicon.

Bare polysilicon layers were implanted with molecular oxygen ($O_2^+$) at about 60 keV energy to doses in the range $2.5 \times 10^{14}/cm^2$ to $1 \times 10^{15}/cm^2$. Molecular oxygen was used for convenience in selecting the energy. These implants are equivalent to providing twice the dose of atomic oxygen ($O^+$) at half the energy, i.e. $5 \times 10^{14}$ to $2 \times 10^{15}/cm^2$ at 30 keV. The low equivalent energy was desired in order to place the peak of the implanted oxygen distribution at or very close to the surface of the poly layer.

It is estimated that for a 30 keV equivalent energy implant, the peak of the implanted oxygen distribution lies about 0.06 microns below the poly surface. Since the implanted oxygen concentration falls off exponentially with distance on either side of the peak, the oxygen concentration at the surface in this case is expected to be about ten percent of the peak value. These doses correspond to a peak concentration of about $7 \times 10^{19}$ to $3 \times 10^{20}$ oxygen atoms/$cm^3$, respectively, that is, to a peak oxygen concentration in the polysilicon of about 0.1% to 0.6%. The oxygen concentration in the silicon at the exposed poly surface is estimated to be about one tenth of the peak values, i.e., about 0.01% to 0.06%. These concentrations are far below that required to form a surface dielectric layer analogous to the cap layer used in the prior art.

FIGS. 3A–C shows Scanning Electron Microscope (SEM) micrographs of various portions of the surface of a polysilicon layer at several magnifications, with and without implanted oxygen, after being subjected to the heating procedure described above known to produce hillock formation in un-capped poly layers. The size of the features visible in the micrographs may be judged by reference to the scale bars associated with each figure. The smooth appearing regions at the left of FIGS. 3A–B are the regions of the poly layer which had been oxygen implanted to a dose of $2 \times 10^{15}$ ions/cm$^2$ at 30 keV equivalent. The rough appearing regions at the right of FIGS. 3A–B and in FIG. 3C had received no oxygen implant. It is readily apparent that hillock formation is substantially arrested in the portions of the poly layer which have been oxygen implanted.

Samples which had been implanted with a dose of $5 \times 10^{14}$ ions/cm$^2$ at 30 keV equivalent showed only a marginal change in the propensity to form hillocks during uncapped heating. The lower the energy, the lower the dose which is likely to be effective in suppressing hillock formation since more of the implanted oxygen is close to the surface grain boundaries. Doses in the range of about $10^{15}$ to $5 \times 10^{16}$ ions/cm$^2$ are believed to be useful with $2 \times 10^{15}$ to $10^{16}$ ions/cm$^2$ being convenient. It is expected that the hillock prevention effect will increase with increasing dose, i.e., the layers will be able to withstand longer exposures to higher and higher temperatures. However, the resistivity of the surface region of the layers is also expected to increase with increasing dose. The presence of a high resistivity region next to or at the upper surface may cause high contact or sheet resistance. This is generally not desirable. If a silicon implant is used to inhibit hillock formation, there is no risk of forming such an insulating layer. This is an advantage of using silicon implantation.

The energy of the implant should be adjusted to place the peak of the implanted oxygen or nitrogen just under the surface of the polycrystalline semiconductor layer. For polysilicon, O$^+$ energies in the range 10–50 keV are useful with 20–40 keV being convenient and about 30 keV being typical. Those of skill in the art understand how to vary implant energy in order to achieve different implant penetrations for different grain sizes, different target materials and different implant ions, and that different energies may be required for such different grains sizes, materials and implant ions in order to place the peak concentration of the hillock inhibiting atoms or ions adjacent to or within a diffusion length of the exposed surface of the polycrystalline semiconductor layer.

The stability of the oxygen implants was investigated by Auger Electron Spectroscopy on capped poly layers which had been implanted to $10^{16}$ ions/cm$^2$ at 200 keV. The implanted oxygen concentration versus distance from the poly surface was measured on as-implanted samples and on samples that had received high temperature treatments similar to that used to induce hillock formation. Within the accuracy of the measurement technique, no significant migration or spreading of the implanted oxygen distribution was apparent. The above described results indicate that the oxygen has, at most, migrated to the grain boundaries of the polycrystalline layer and precipitated there. It has not migrated throughout the poly layer. It is believed that the precipitation of implanted oxygen on the grain boundaries near the exposed surface inhibits the grain-to-grain silicon transport that is necessary for formation of hillocks, and thus inhibits hillock growth. It is desirable that the peak of the implanted oxygen or nitrogen distribution be within about 0.1–0.2 microns of the surface for layers thicker than about one micron and within about the top 10–20% of the layer thickness for layers thinner than about one micron.

The oxygen or nitrogen precipitated on the grain boundaries is chemically bound and is therefore believed to permanently block silicon migration along the grain boundaries. Thus the result of implanting oxygen or nitrogen is different than for other materials, such as for example silicon, which merely amorphize the surface and do not form a chemically stable second phase at the grain boundaries. Accordingly, the hillock blocking effect of the oxygen or nitrogen is expected to be be more resistant to annealing during high temperature processing and be more permanent as compared to mere amorphization of the poly surface.

The effect of oxygen implantation on the sheet resistance of the poly layers was measured for oxygen implant doses of $10^{14}$ to $10^{16}$ ions/cm$^2$ at 200 keV. The layers were arsenic doped after oxygen implantation to $5 \times 10^{15}$ arsenic ions/cm$^2$ at an energy of 150 keV and then activated using the RTA technique at peak temperatures ranging from 1100–1200 degrees. The effective time at temperature was estimated to be about one second. The higher the activation temperature, the lower the resulting sheet resistance. The sheet resistance was measured using a standard four point probe. Such techniques are well known in the art. Some of the layers were annealed prior to oxygen implantation to increase the typical grain size from about 0.02 to 0.2 microns. Control samples without oxygen implantation were similarly doped.

The sheet resistances of the various oxygen free layers varied from about 62–125 ohms per square. Sheet resistance of otherwise identical layers receiving various oxygen doses were 62–130 ohms per square for a dose of $10^{14}$ ions/cm$^2$, 65–160 ohms per square for a dose of $10^{15}$ ions/cm$^2$, and 90–240 ohms per square for a dose of $10^{16}$ ions/cm$^2$. While the oxygen implants in these tests were deeper in the layers than those used for determining the hillock inhibiting effect, the results demonstrate that oxygen implants in the same dose range do not destroy the conducting nature of the polycrystalline silicon layers and that the arsenic doped poly-layers still have comparatively low resistance even after such oxygen or nitrogen implantation.

Uncapped polysilicon layers substantially similar to those described above were near-surface implanted with silicon to a dose of about $1 \times 10^{15}$ ions/cm$^2$ at 100 kev and tested for hillock growth by heating in the same manner as for the oxygen implanted layers. The peak of the implanted silicon is believed to be about 0.06 microns below the poly surface. It was observed that hillock formation was also suppressed in the polysilicon layers implanted with silicon. Doses in the range $5 \times 10^{14}$ to $2 \times 10^{16}$ ions/cm$^2$ and energies in the range 10–200 keV are useful with $1 \times 10^{15}$ to $1 \times 10^{16}$ ions/cm$^2$ and 50–150 keV being preferred. Larger doses can also be used.

Silicon has the advantage that it does not alter the acceptor or donor concentration in the poly layer, and, once the implant damage is annealed, should have no effect on the contact or sheet resistance. However, the silicon implant does not provide a stable precipitate complex on the grain boundaries as do oxygen and nitrogen, hence the hillock formation inhibition effect of the silicon may not be as permanent as for oxygen and nitrogen, i.e., may not be able to withstand as severe heat treatments.

Polysilicon layers which had been near-surface implanted with silicon to $1 \times 10^{15}$ ions/cm$^2$ at 100 keV as described above, and which showed hillock blocking effects similar to that illustrated in FIGS. 3A-B, were examined in cross-section by Transmission Electron Microscopy (TEM). After silicon implant and prior to the heat treatment to test for hillock formation, the region near the exposed poly surface where the silicon implant had occurred showed conventional indications of implant damage, i.e., the near surface region of the poly for a depth of about 0.15 microns appeared amorphous. After heat treatment to anneal the implant damage and test for hillock formation, the silicon implanted region was indistinguishable from the rest of the poly layer. No amorphous phase associated with the silicon implant could be detected. The polysilicon grains continued uninterrupted to the exposed surface.

While the invented means and method has been illustrated in terms of polycrystalline silicon layers and oxygen, those of skill in the art will understand that other grain boundary fixing elements or mixtures of elements, such as nitrogen or nitrogen oxygen mixtures for example, could also be used. Further, those of skill in the art will understand that other dopants besides arsenic can be employed as the conductivity altering dopant. Further, those of skill in the art will understand that the principles taught herein apply to other semiconductor materials, such as for example, but not limited to, germanium and III-V materials. Accordingly, it is intended to include all such variations in the claims which follow.

We claim:

1. A method for preventing hillock formation in polycrystalline semiconductor layers comprising:
   providing a substrate having thereon a polycrystalline semiconductor layer with an exposed surface;
   implanting oxygen into said exposed surface only to a predetermined depth and dose in the range about $10^{15}$ oxygen ions/cm$^2$ to $5 \times 10^{16}$ oxygen ions/cm$^2$ at energy in the range about 10-50 keV, O$^+$ equivalent, without implanting oxygen deeper into said layer than said predetermined depth; and
   thereafter heating said layer.

2. The method of claim 1 wherein said implanting step comprises implanting oxygen only to said predetermined depth and dose in the range about $2 \times 10^{15}$ ions/cm$^2$ to about $10^{16}$ ions/cm$^2$ at energies in the range about 20-40 keV, O$^+$ equivalent.

3. A method for preventing hillock formation in polycrystalline semiconductor layers comprising:
   providing a substrate having thereon a polycrystalline semiconductor layer with an exposed surface;
   implanting oxygen into said exposed surface only in a near surface region of said polycrystalline layer corresponding to an implant energy in the range about 10-50 keV, O$^+$ equivalent, and to a peak concentration within the polycrystalline semiconductor layer in the range of about $7 \times 10^{19}$ atoms/cm$^3$ to $3 \times 10^{20}$ atoms/cm$^3$; and
   thereafter heating said layer.

* * * * *